United States Patent [19]

Coffin

[11] Patent Number: 5,894,225

[45] Date of Patent: Apr. 13, 1999

[54] TEST FIXTURE

[76] Inventor: Harry S. Coffin, 99 Daylesford Blvd., Berwyn, Pa. 19312

[21] Appl. No.: 08/742,001

[22] Filed: Oct. 31, 1996

[51] Int. Cl.$^6$ ............................. G01R 1/073; G01R 31/02
[52] U.S. Cl. ........................................ 324/762; 324/158.1
[58] Field of Search ............................ 324/761, 73.1, 324/158.1, 537, 754

[56] References Cited

U.S. PATENT DOCUMENTS

| | | | |
|---|---|---|---|
| 2,918,648 | 12/1959 | Ludman et al. | 324/537 |
| 4,536,051 | 8/1985 | Smith et al. | 324/537 |
| 4,636,723 | 1/1987 | Coffin | 324/763 |
| 4,643,501 | 2/1987 | Coffin | 324/537 |
| 4,746,861 | 5/1988 | Nesbitt | 324/761 |
| 5,087,878 | 2/1992 | Belmore, III et al. | 324/754 |
| 5,214,374 | 5/1993 | St. Onge | 324/754 |
| 5,247,249 | 9/1993 | Seavey | 324/756 |
| 5,396,186 | 3/1995 | Schentzow | 324/754 |
| 5,430,385 | 7/1995 | Hutton et al. | 324/754 |

*Primary Examiner*—Ernest F. Karlsen
*Attorney, Agent, or Firm*—Eugene Chovanes

[57] ABSTRACT

A test fixture for printed circuit boards wherein the circuit board being tested is clamped to a vacuum actuated diaphragm plate by the same vacuum that actuates the diaphragm plate. The vacuum is automatically applied to both the diaphragm plate and the clamp means when the cover on the test fixture is closed. A bridge extends over, and is in clamping contact, with the circuit board. The bridge is supported from platens in vacuum chambers on the upper side of the diaphragm plate.

2 Claims, 6 Drawing Sheets

TEST FIXTURE

BACKGROUND OF THE INVENTION

1. Field of the Invention

This invention relates to test fixtures for testing printed circuit boards.

2. Prior Art

Test fixtures for printed circuit boards are well known and in extensive use. Typical test fixtures are shown in U.S. Pat. Nos. 4,636,723, 4,746,861, 5,247,249 and 5,430,385.

In such fixtures, a fixed board in a base supports spaced vertical contact probes which are spring biased upwardly and aligned with contacts points on a circuit board which is inserted into the fixture above the test probes. The circuit board extends in a horizontal plane. The printed circuit board is displaced downwardly against the biased probes which are connected to a computer which evaluates the components and connections in the circuit board. A moveable board, which is often referred to as a diaphragm board, since vacuum is used to move such circuit board downwardly, carries the printed circuit board to be tested into contact with the probes.

In one prior art embodiment, the circuit board for test purposes is fixed or clamped to the diaphragm board by a mechanical latch operated manually by the test operator. It is necessary to clamp the circuit board to the diaphragm board, since the total force exerted by the test probes, which are biased upwardly generally by springs, can be substantial, and often in an amount collectively of a force of 600 pounds or more.

In another prior art embodiment, a box forms a vacuum chamber over the printed circuit board. Hold down studs extend downward from the top of the box against the circuit board. Such a box has to be airtight, which prevents access to the components on the board which have to be adjusted, or switches that have to be changed. Additionally, such a construction does not allow for probing with a manual probe.

In summary, in the prior art a printed circuit board is either manually mechanically clamped to a diaphragm board which is then moved by vacuum toward spring biased test probes for contact with the probes and testing of the circuit board, or held by studs within an enclosed vacuum box that prevents easy access to the circuit board.

SUMMARY OF THE PRESENT INVENTION

In the present invention the vacuum used to move the diaphragm board is also used to clamp the printed circuit board on to the diaphragm board. Such action is accomplished by utilizing separate vacuum chambers, away from the printed circuit board, to lower a clamp in the form of a bridge, against the upper or exposed side of the printed circuit board. The bridge has a number of adjustable vertical rods which come in contact with the printed circuit board and hold the board firmly and securely against the diaphragm board. Thus, the vacuum which is applied into the chamber between the diaphragm board and the fixed board supporting the test probes, is also used simultaneously and automatically to clamp the circuit board to the diaphragm board.

DESCRIPTION OF THE PREFERRED EMBODIMENT

Figure 1:
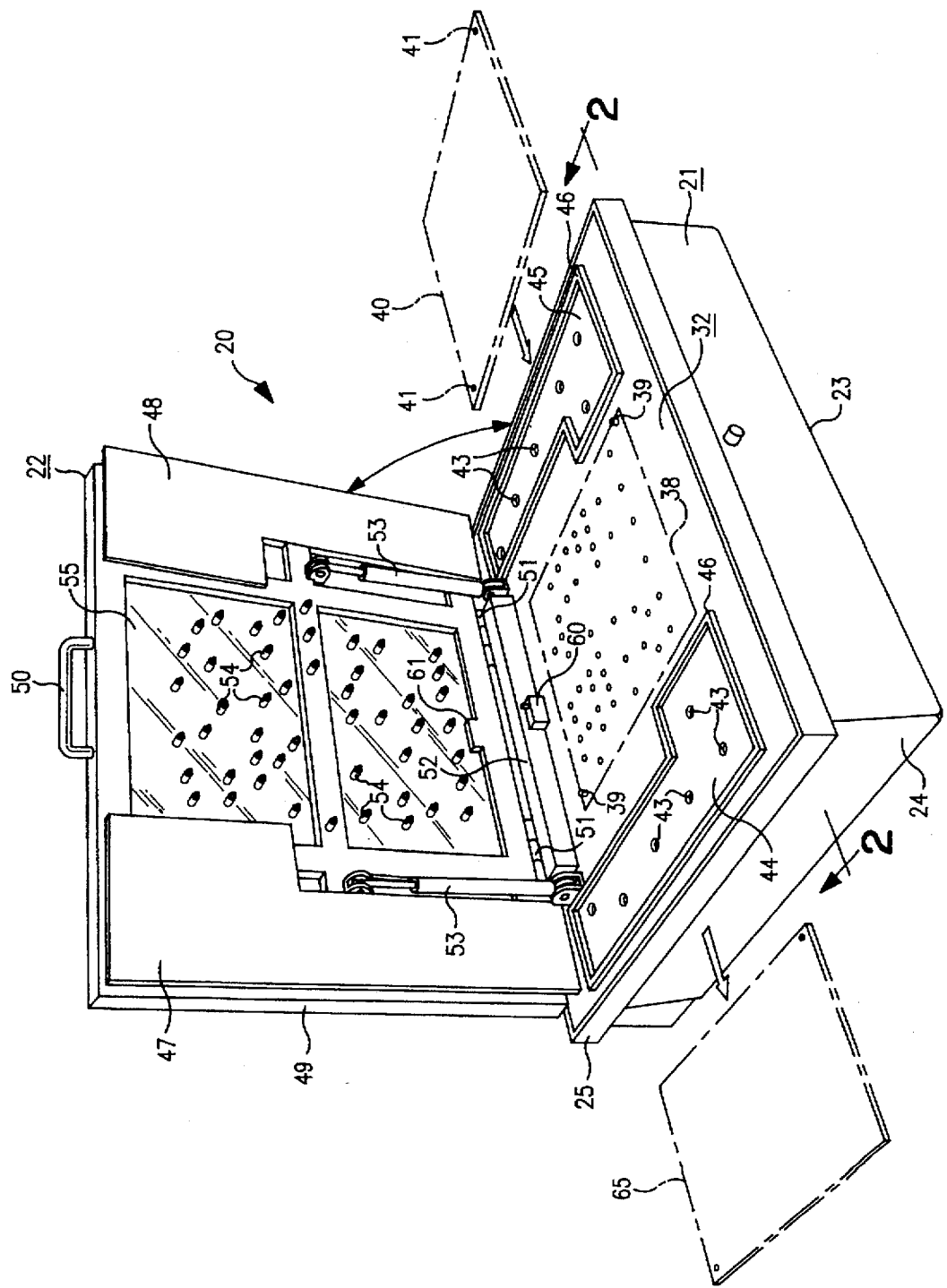
FIG. 1 is a perspective view of the printed circuit board of the invention. The testing device is shown with the hinged cover assembly in an opened position. The hinged cover assembly includes a centrally located array of rods. Vacuum chambers are shown on the diaphragm plate in the base, on each side of a circuit board, shown in dot and dash outline, to be tested.
Figure 2A:
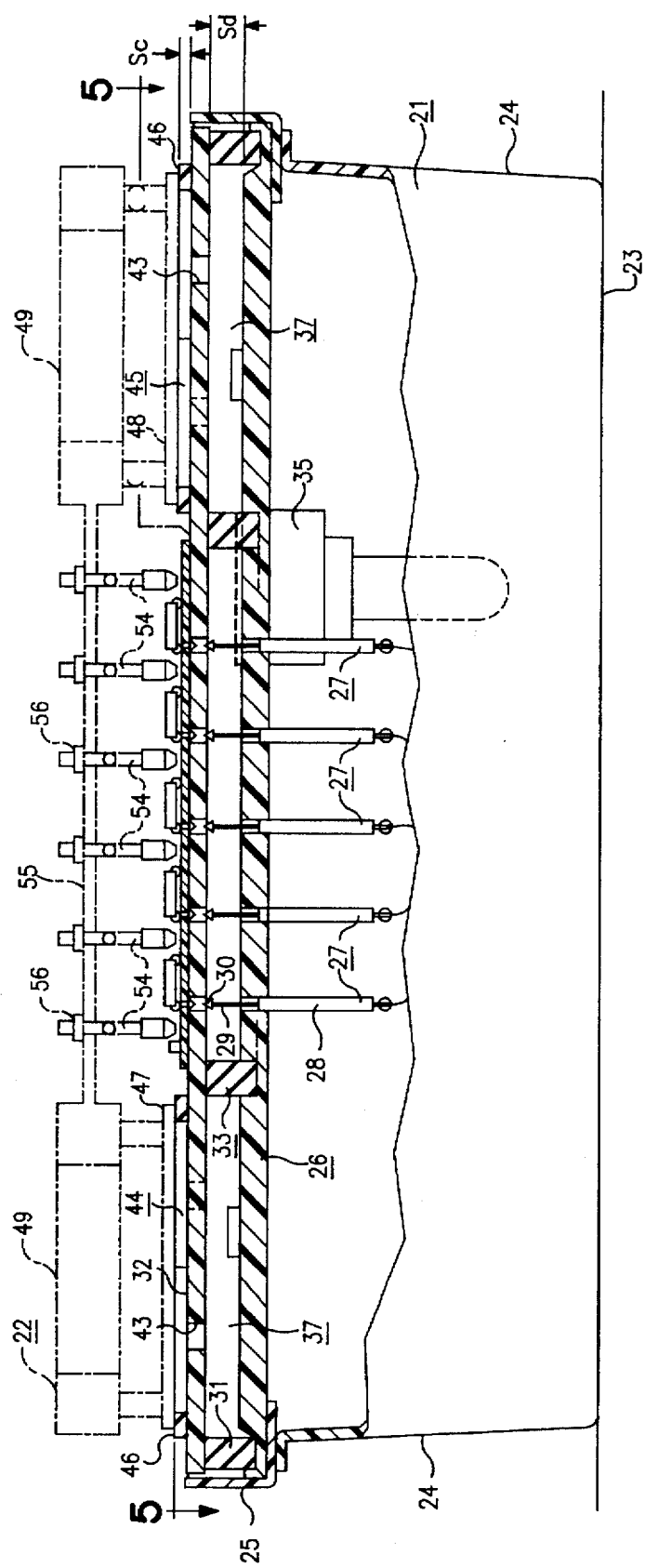
FIG. 2A is an enlarged schematic sectional elevational view taken on the line 2,2 of FIG. 1. The cover assembly is shown in dot and dash outline in a closed position, but with no vacuum applied, in order to show the relative positions of the components of the testing device with respect to a circuit board to be tested.

There is shown in FIG. 1 a testing device 20 comprising a base 21 and a hinged cover assembly 22. Base 21 has a bottom 23, sides 24, and a peripheral rim 25 as seen in FIG. 2A. Base 21 has fixed therein a probe plate 26 having vertically extending probes 27 mounted therein. Probes 27 have a cylinder 28 fixed to probe plate 26 and a moveable piston rod 29 with a probe contact tip suitably pointed at 30. Piston rod 29 is biased upwardly by a compression spring located within cylinder 28. Such construction is well known in the prior art and is disclosed in the patents cited above, herein incorporated by reference. Extending around the periphery of probe plate 26 is an outer flexible seal 31. Such seal extends completely around the periphery of the probe plate within the peripheral rim 25 of base 21.

Floating above fixed probe plate 26 and resting on seal 31 is a diaphragm plate 32.

An inner flexible seal 33 extending in rectangular fashion is positioned between the diaphragm plate 32 and the probe plate 26. The inner seal 33, as viewed from above, extends rectangularly within outer seal 31, and forms a vacuum chamber 37 that is isolated from probes 27.

Figure 4:
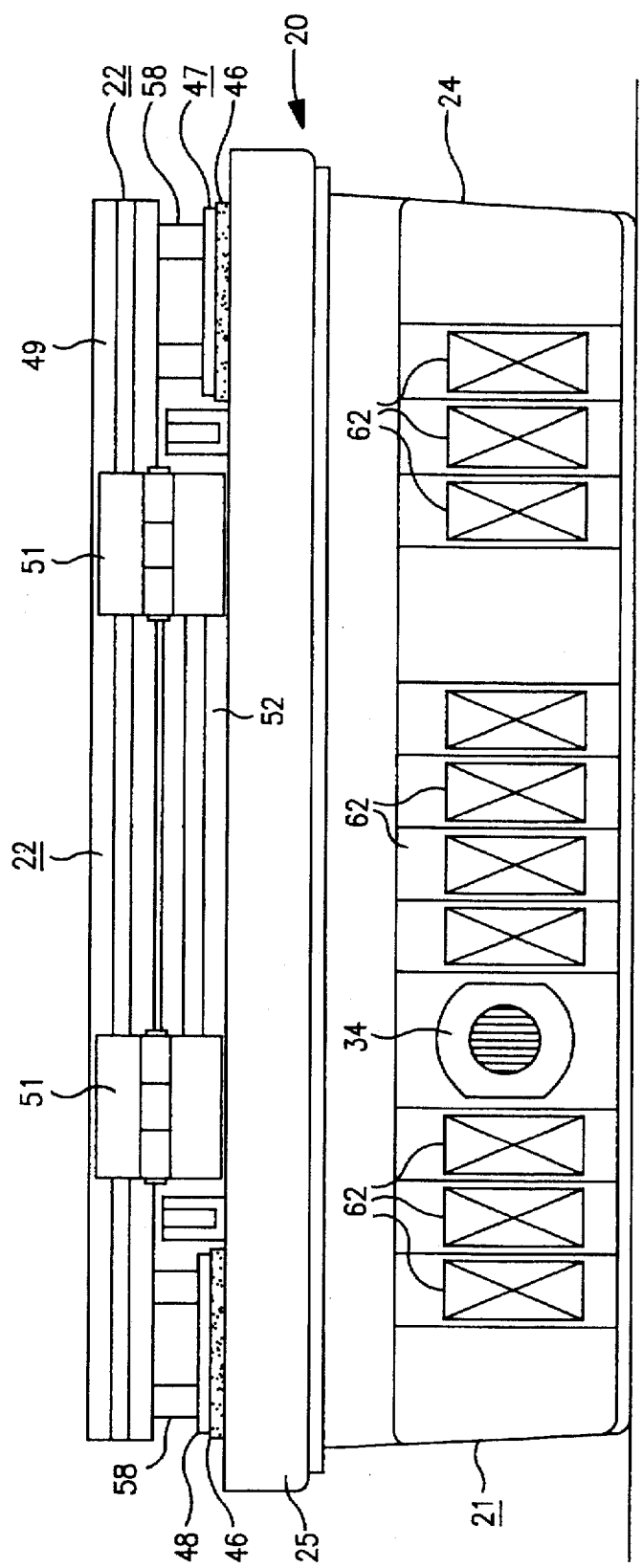
FIG. 4 is a reduced scale rear elevational view of the testing device shown in FIGS. 1–3, with the cover assembly in a closed position showing additional details of the hinged cover assembly, a series of pin sockets for the electrical connection to a computerized test system, and a vacuum port.
Figure 5:
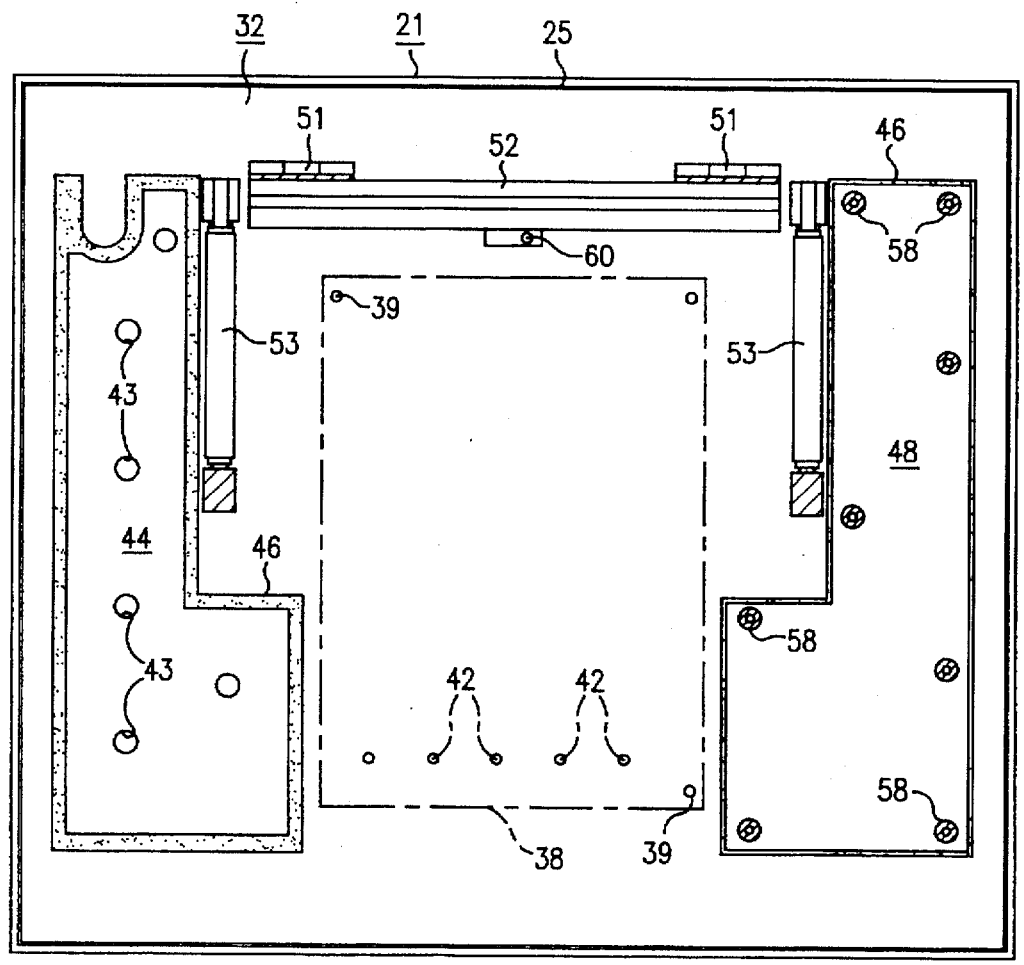
FIG. 5 is a stepped plan view at a reduced scale taken on the line 5,5 of FIG. 2A. This shows additional details of the diaphragm board, the ports to the vacuum chambers that clamp, the location, in a dot and dash outline, of a circuit board to be tested, the indexing pins, the hinge mounting assembly, and the micro-switch for initiating the vacuum and testing sequence.

A suitable outside source of vacuum is connected to vacuum port 34 as seen in FIG. 4 in base 21. Vacuum port 34 is connected through vacuum conduit 35 to fixed probe plate 26, through an opening therein, to vacuum chamber 37 bounded by fixed probe plate 26 and diaphragm board 32 and outer seal 31 and inner seal 33. It can be seen that when vacuum is applied through vacuum conduit 35 to vacuum chamber 37, diaphragm board 32 moves downwardly against flexible seals 31 and 33.

Diaphragm board 32 has an area therein designated as 38 in FIG. 1, intended to receive the printed circuit board to be tested. Index pins 39 fixed therein serve to position or register the circuit board 40 intended to be tested. Circuit board 40 has therein registry holes 41 which receive index pins 39. Holes 42 at suitable locations in diaphragm plate 32 permit probes 27 and particularly the points thereof to extend upwardly through the plate 32 into contact with contact points on the circuit board 40 supported by the diaphragm plate 32.

The structure and operation so far described is common in the prior art.

Figure 2B:
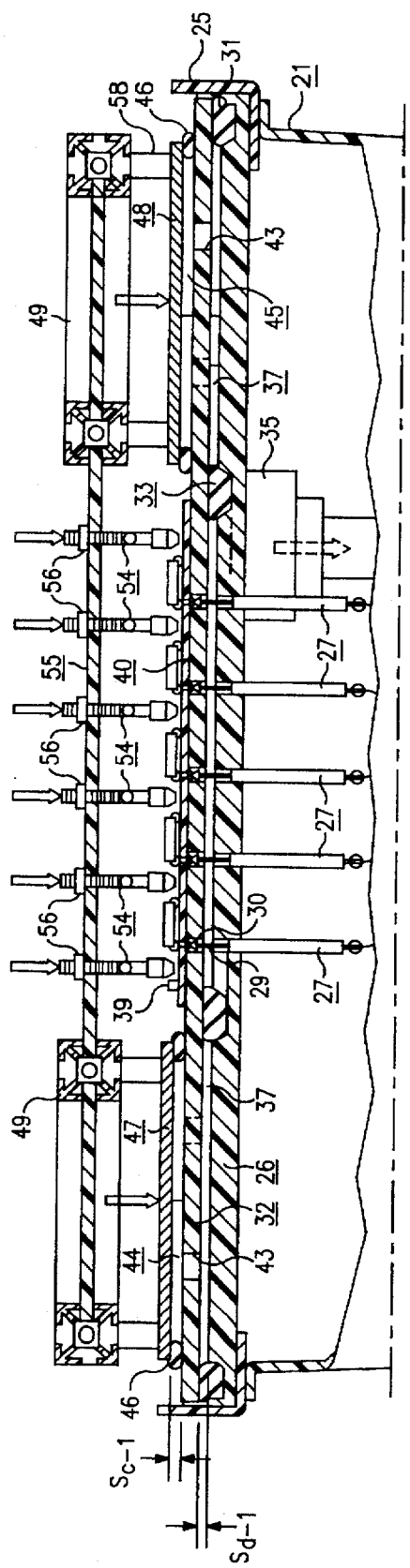
FIG. 2B is a view similar to FIG. 2A but showing the relative positions of the components of the testing device with respect to the circuit board being tested, when the cover is closed, and a vacuum is simultaneously applied to both the diaphragm board in the base, and to platens in the cover assembly.

The device of the invention is concerned with properly clamping the printed circuit board 40 to the diaphragm board 32 as seen for instance in FIGS. 2A and 2B. It will be seen that in the absence of a suitable clamp, the circuit board 40 would be simply lifted from the diaphragm board 32 as the diaphragm board and the circuit board move downward against the probes 27 which, collectively, as indicated above can, in some instances, exert as much as 600 or more lbs. upward force against the circuit board.

In the prior art, a mechanical clamp which required a latch mechanism was used. The test operator actuated such clamp latch mechanism manually.

In the present invention, the circuit board 40 is clamped to the diaphragm board 32 by the clamp 49 by vacuum applied to platens 47 and 48. The clamp can be applied automatically when cover 49 is closed.

Holes 43 extend vertically through the diaphragm plate to form second vacuum chambers 44 and 45 at the sides of the testing device. Such vacuum chambers are defined by flexible, resilient seals 46 which extend around the periphery of the chambers. Such seals are of a suitable flexible rubberlike material which can be compressed and which then substantially restore themselves to their original shape.

Hinged cover assembly 22 has platens 47 and 48 which conform to the vacuum chambers 44 and 45 which can be of L-shape or any appropriate shape as shown in FIG. 1. Such platens 47 and 48 are suitably of a smooth, impermeable material such as aluminum or plastic. The cover assembly 22 consist of a framed structure 49 having a handle 50 and hinges 51 anchored on diaphragm board 32 through hinge mounting block 52. The cover assembly 22 is held in an open position by means of two piston actuated damping cylinders 53 which are connected to the diaphragm board 32 at one end, and to the cover frame 49 at the other end, to provide a counter-balance mechanism, and to provide a stabilizing effect when the cover is open.

Located in the cover are an array of hold-down rods 54 which are threaded into panels 55 fixed in cover frame 49. Such panels 55 are desirably transparent but permissibly opaque. The array of rods 54 can also be mounted directly into an integral cover construction wherein cover 49 is of one piece. The rods 54 are positioned in the array to provide as many pressure points as necessary against circuit board 40 to hold the board firmly against diaphragm board 32, as the diaphragm plate is moved downwardly and the board is brought into contact with probes 27. Rods 54 do not touch or contact any electronic component of the circuit board 40. Rods 54 are mounted into holes in panels 55 and are suitably adjusted to provide proper contact when the clamping action is activated as will be shown and described. Such adjustment provides a clearance of approximately 0.001" when unclamped and the cover closed. Lock nuts 56 lock the rods in the desired adjusted position. In an alternative embodiment, panels 55 are replaced by bars or cross member which extend over the printed circuit board test area, and are mounted in frame 49. In either embodiment the space above the circuit board does not have to be airtight and can give access to the components on the board. In the cross member embodiment, virtually full access is available to the component on the circuit board.

Cover frame 49 is formed of extruded aluminum frame members that support panels 55. Platens 47 and 48 described above are held in fixed relationship to the cover frame 49 by spacers 58. Suitably secured to the upper surface of diaphragm board 32 are the seals 46 described above which come into contact with the platens 47 and 48 when the cover assembly 22 is closed, forming vacuum chambers 44 and 45 as seen for instance in FIG. 2A and FIG. 2B. A micro-switch 60 is mounted on the hinge block 52 at the position shown and an actuator 61 is positioned on the cover assembly 22 so that, when the cover is closed, switch 60 closes the electrical contact which in turn engages the vacuum. Closing of switch 60 also initiates the desired testing of the circuits and components of a circuit board. This will initiate the vacuum which will simultaneously clamp the circuit board 40 to the diaphragm plate 32 and lower the diaphragm board 32 with circuit board 40 clamped thereon, into contact with probes 27.

The probe points 30 are connected through suitable electrical connections to the pin sockets 62 which in turn are connected through suitable socket connectors to the computer and computer program for testing as in the prior art.

Figure 3:
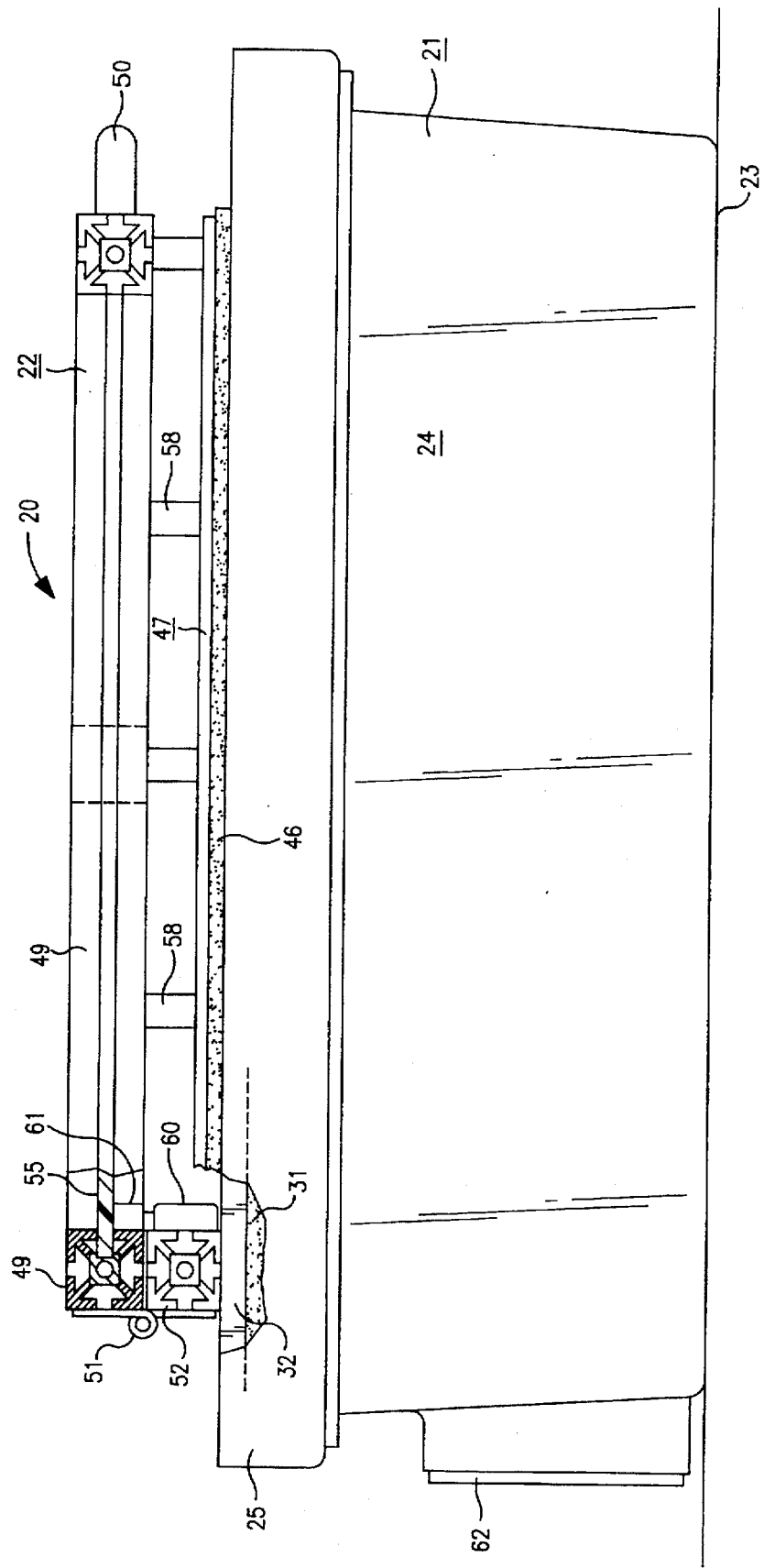
FIG. 3 is an enlarged left hand side elevational view of FIG. 1 showing the cover assembly in a closed position with a small portion of the view broken away and in section.

In operation, as seen in FIG. 1, a circuit board 40 is moved from the right into and onto the diaphragm board 32, wherein indexing pins 39 register with holes 41 to properly and accurately position the circuit board 40 on the diaphragm board 32. The operator then grasps handle 50 on the hinge cover assembly 22 and closes the cover into a position as shown in section on FIGS. 2A and FIG. 3. In this position, diaphragm board 32 rests against seals 31 and 33. Actuator 61 comes into contact with the actuator button on microswitch 60, closing the contact and signaling the computer to begin the series of test operations as programmed. A first step in such operation is to activate a vacuum, for instance 12 pounds per square inch into vacuum chamber 37 between diaphragm plate 32 and probe plate 26. This vacuum also passes through holes 43 into vacuum chambers 44 and 45. The vacuum in chambers 44 and 45 causes platens 47 and 48 to fit tightly against seals 46 bringing rods 54 into pressure contact with circuit board 40, thus clamping the circuit board 40 to the diaphragm board 32. Simultaneously diaphragm board 32 is drawn downwardly against seals 31 and 33, as seen in FIG. 2. The entire upper cover 22 assembly along with diaphragm plate 32 moves as one unit downwardly against the upperwardly spring biased rods 29 and points 30 of probes 27. Once contact is made with the various connections and components in the circuit board 40, the computer program conducts the necessary tests on the circuit board 40 connections and components. Once one such test is completed, the vacuum is broken and the diaphragm board 32 and cover assembly 22 move from the position of FIG. 2B to the position of FIG. 2A under the influence of the resilient seals 31, 33, and 46.

The operator is then free to raise cover assembly 22 by grasping handle 50 and swinging the cover upward. Circuit board 40 is then removed from the test position and moved away from the test position within the test fixture 20 to the left, to the position 63, as seen in FIG. 1.

The procedure is then repeated with the next board.

It should be understood that the area subjected to vacuum in chambers 44 and 45, combined, should be sufficient to overcome the collective upward resisting force of probes 27. For instance, if the collective resisting force of the probes is 1,200 pounds and the vacuum is 12 pounds per square inch, the area within the chambers of the platens 47 and 48 should be 100 sq. inches. Likewise, the area in the vacuum chamber 37 formed between the diaphragm plate 32 and the probe plate 26 should again have an area sufficient to create a force capable of overcoming the collective resisting forces of the probes 27 and the resilient seals 31 and 33. Again, in the example cited above, the area of the diaphragm board 32 in the vacuum chamber 37 exposed to the vacuum should be at least 100 sq. inches.

It will thus be seen that in the device of the invention, the vacuum which in the prior art was used to move the diaphragm board is now also used to clamp the circuit board to the diaphragm board. The operation is fully automatic and simply requires an opening and closing of the cover to conduct the test operation. The test fixture of the invention will function even if the circuit board has holes. This eliminates any need, as was necessary in the prior art, to cover the upper surface of the circuit board with a resilient cloth to cover such holes. Such a cover not only required effort to apply, but sometimes resulted in shifting components and connections, resulting in a false test. If the circuit board has no holes fixture will operate with or without resilient seal 33 by adding resilient seal 46 under circuit board 40.

I claim:

1. In a test fixture for testing printed circuit boards having
   a) a base with
   1. a fixed plate,
   2. test probes mounted in the plate,
   3. biasing means in the test probes exerting collectively a total force upward,
   4. a diaphragm board extending horizontally within and movably supported by the base,
   5. a first vacuum chamber between the diaphragm board and the fixed plate into which vacuum is selectively applied for drawing down the diaphragm board, and
   6. means on the diaphragm board for clamping a circuit board thereon; and
   b) a cover assembly on the base having an open and closed position;

an improvement in the means for clamping comprising
   1. a second vacuum chamber having resilient seals between the diaphragm board and the cover assembly in the closed position,
   2. holes between the first vacuum chamber and the second vacuum chamber;
   3. a platen in the cover assembly forming a first wall of the second vacuum chamber;
   4. a portion of the diaphragm board forming a second wall opposite the first wall in the second vacuum chamber, and
   5. a bridge connection from the platen to a circuit board being tested
   wherein
      (a) upon application of vacuum in the first vacuum chamber,
      (b) a vacuum is formed in the second vacuum chamber drawing the platen and bridge against the circuit board toward the diaphragm board,
      (c) causing the circuit board to be clamped against the diaphragm board during a testing procedure.

2. A test fixture of claim 1 wherein vacuum is applied in the first chamber when the cover assembly on the base is moved from an open to a closed position.

* * * * *